(12) United States Patent
Trassl et al.

(10) Patent No.: US 8,157,975 B2
(45) Date of Patent: Apr. 17, 2012

(54) SPRAYED SI- OR SI:AL-TARGET WITH LOW IRON CONTENT

(75) Inventors: Roland Trassl, Giessen (DE); Wolf-Eckart Fritsche, Kahl (DE)

(73) Assignee: Applied Materials, Inc., Santa Clara, CA (US)

( * ) Notice: Subject to any disclaimer, the term of this patent is extended or adjusted under 35 U.S.C. 154(b) by 542 days.

(21) Appl. No.: 12/388,342

(22) Filed: Feb. 18, 2009

(65) Prior Publication Data

US 2009/0218213 A1 Sep. 3, 2009

Related U.S. Application Data

(60) Provisional application No. 61/032,139, filed on Feb. 28, 2008.

(30) Foreign Application Priority Data

Feb. 28, 2008 (EP) .................................... 08152076

(51) Int. Cl.
*C23C 14/00* (2006.01)

(52) U.S. Cl. .................................................. 204/298.22
(58) Field of Classification Search ............. 204/298.22
See application file for complete search history.

(56) References Cited

U.S. PATENT DOCUMENTS

| | | | |
|---|---|---|---|
| 5,571,393 A | 11/1996 | Taylor et al. | |
| 5,853,816 A | 12/1998 | Vanderstraeten | |

FOREIGN PATENT DOCUMENTS

| | | |
|---|---|---|
| EP | 1249509 A2 | 10/2002 |
| EP | 1722005 B1 | 7/2007 |
| WO | WO 2004/016823 A1 | 2/2004 |

OTHER PUBLICATIONS

Extended European Search Report for EP 8152076.9; Aug. 8, 2008.

*Primary Examiner* — Christopher Young
(74) *Attorney, Agent, or Firm* — Patterson & Sheridan, LLP

(57) ABSTRACT

A sputter target for sputtering a silicon-containing film is provided. The target includes a silicon-containing sputter material layer, and a carrier for carrying the sputter material layer, wherein the sputter material layer contains less than 200 ppm iron.

21 Claims, 3 Drawing Sheets

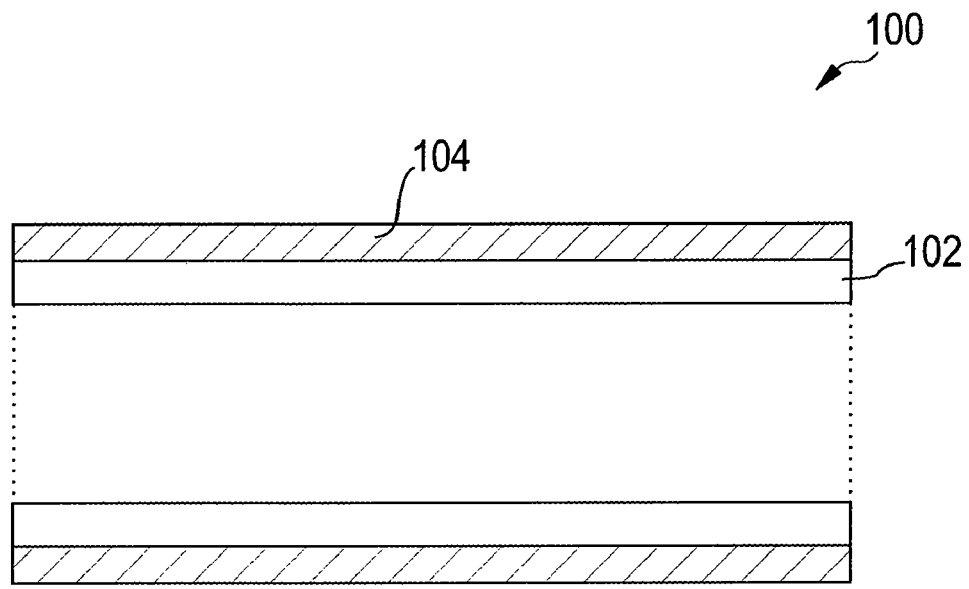
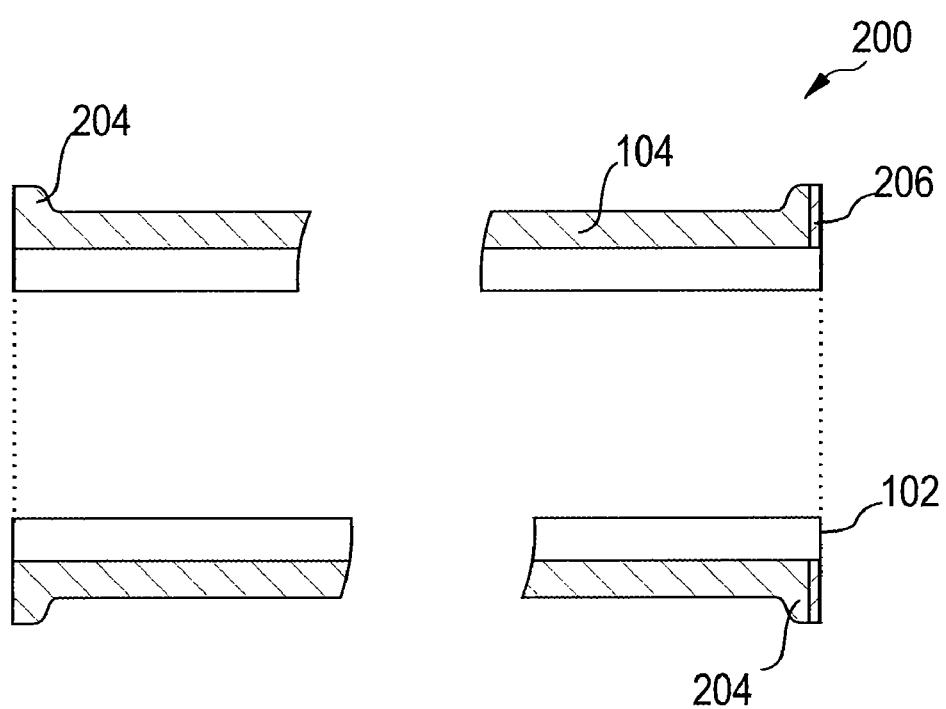

SPRAYED SI- OR SI:AL-TARGET WITH LOW IRON CONTENT

FIELD OF THE INVENTION

The invention relates to sputter targets and, in particular to silicon-containing sputter targets. More particularly, it relates to rotary sputter targets for sputtering silicon-containing films. Specifically, it relates to a sputter target, a sputtering apparatus, a use of a sputtering target and a method of manufacturing a sputter target.

BACKGROUND OF THE INVENTION

Modern solar cells can be produced depositing various layers such as silicon containing layers on a substrate. A solar cell is a device that converts light energy into electrical energy. One method to evaluate the economic costs of a solar cell is to calculate the price of a solar cell panel per delivered kW-hour. Accordingly, it is on the one hand desirable to have low cost production. Further, on the other hand, the conversion efficiency of a solar cell should be optimized for increasing the power output. A promising candidate for solar cell manufacturing, are solar cells including silicon layers or silicon containing layers.

Silicon containing layers for solar cell production are often deposited by chemical vapor deposition (CVD) or plasma-enhanced chemical vapor deposition (PECVD). However, sputtering of silicon thin-films, silicon nitride thin-films or other silicon-containing films can be used for reducing costs for solar cell production.

During sputtering atoms are emitted from a target by bombardment with e.g. high energy ions. The atoms of the target material are deposited on a substrate to generate a silicon containing layer. It has been found that sputtering of silicon films from conventional rotary silicon targets may not result in a good conversion efficiency of a solar cell. Thus, there is a need for an improved target for sputtering silicon thin-films.

SUMMARY

In light of the above, a target according to independent claim 1, a sputtering apparatus according to claim 12, use of a sputter target according to independent claim 13, and a method of manufacturing a silicon-containing target according to independent claim 14 are provided.

Further aspects, advantages and features are apparent from the dependent claims, the description and the accompanying drawings.

According to one embodiment, a sputter target for sputtering a silicon-containing film is provided. The sputter target includes a silicon-containing sputter material layer, and a carrier for carrying the sputter material layer, wherein the sputter material layer contains less than 200 ppm iron.

According to a further embodiment, a sputtering apparatus is provided. The sputtering apparatus includes a sputter target for sputtering a silicon-containing film. The sputter target includes a silicon-containing sputter material layer, and a carrier for carrying the sputter material layer, wherein the sputter material layer contains less than 200 ppm iron.

According to yet a further embodiment, a use of a sputter target for depositing a silicon containing film is provided The sputter target includes a silicon-containing sputter material layer, and a carrier for carrying the sputter material layer, wherein the sputter material layer contains less than 200 ppm iron, and wherein the sputter target is used for manufacturing a silicon-containing layer on a substrate for manufacturing of a crystalline solar cell.

According to yet a further embodiment, a method of manufacturing a silicon-containing sputter target is provided. The method includes providing a carrier; providing a silicon-containing powder with an iron content of 200 ppm or below, spraying the silicon-containing powder to deposit a silicon-containing material layer on the carrier.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, wherein:

FIG. 1 shows a schematic view of a silicon-containing target according to embodiments described herein;

FIG. 2 shows a schematic view of a further silicon-containing target illustrating further embodiments described herein;

DETAILED DESCRIPTION OF THE INVENTION

Figure 3:
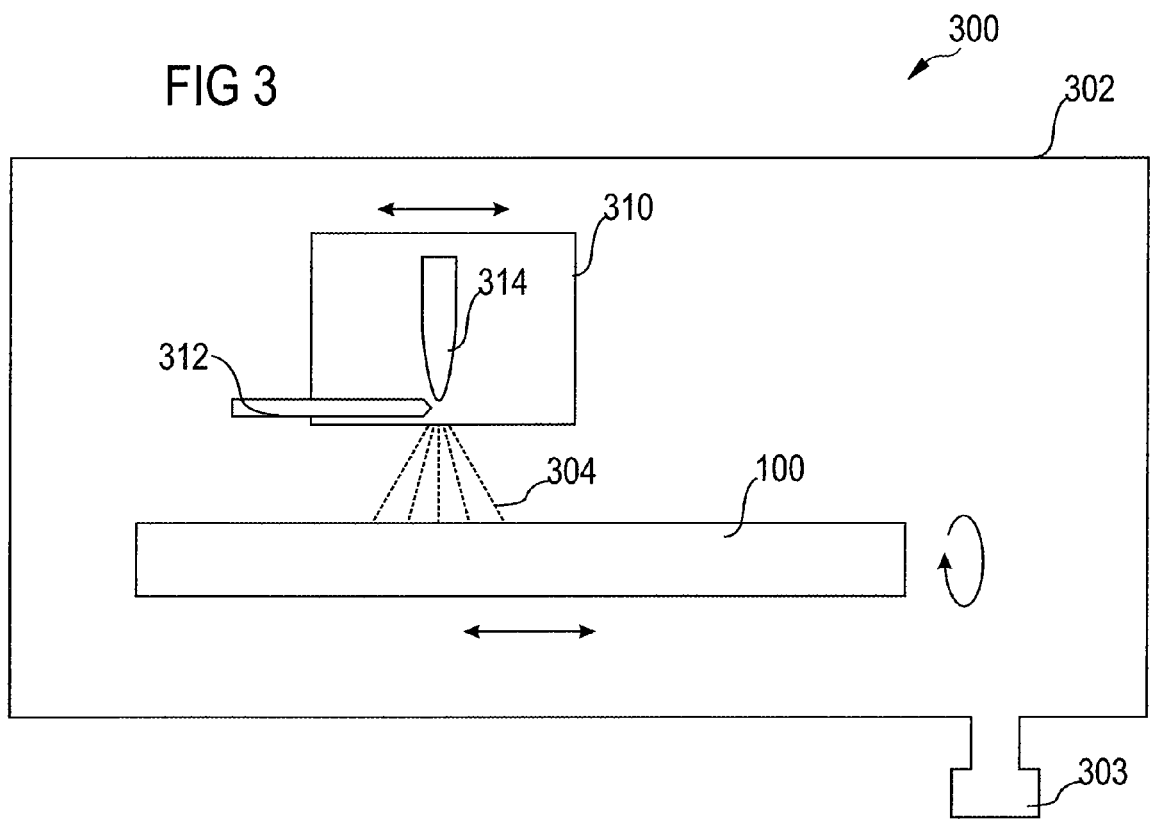
FIG. 3 shows an apparatus for manufacturing a silicon-containing target according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

For manufacturing silicon sputter targets it has to be considered that silicon is a refractory material which commonly results in the flaking of silicon particles or cracks in the silicon material. Flaking and cracking, in particular from state of the art rotary sputter targets, can deteriorate the homogeneity of material deposition during sputtering. Further, the shaping of a target to provide a desired target shape can be difficult for refractory materials like silicon.

According to embodiments described herein, the material layer of the sputtering target can be provided on a carrier or a core, which may for example be a tube including a magnet housing, one or more magnets, one or more pole pieces, cooling fluid assemblies, and/or means allowing a rotation of the rotary target. According to different embodiments thermal spraying techniques like plasma spraying, flame spraying, arc sprayings, or the like are conducted.

FIG. 1 illustrates embodiments of a sputtered target 100. The sputtered target 100 includes a core or carrier 102 of an electrical conductor, which can typically be a non-magnetic or low-magnetic material. A layer 104 of sputter material is provided on the carrier. Thereby, the sputtered target is manufactured to be in its essentially final shape and additional steps of forming or shaping of the refractory silicon material can be omitted.

According to yet further embodiments, which can be combined with other embodiments described herein, below 15 wt-% aluminium, for example below 500 ppm or below 120 ppm aluminium, or between 2 and 15 wt-% aluminum, can be provided in the silicon-containing layer 104. The sputtered target 100 having the carrier 102, for example in form of a carrier tube, and the silicon-containing sputter material layer 104 can, for example, be a silicon layer or a Si:Al-layer to provide a silicon-target or a Si:Al-target.

According to different embodiments, which can be combined with other embodiments described herein, the carrier 102 can include a material like stainless steel, aluminium, titanium, copper, or mixtures thereof. Typically, the carrier material is adapted to have a thermal expansion coefficient similar or equal to the thermal expansion coefficient of the silicon-containing sputter material layer 104.

FIG. 2 illustrates further embodiments, which may additionally include a ring-shaped material portion 204 at the edge of the sputter target. According to yet further embodiments, optionally a protection ring 206 may be provided. The protection ring 206 can be provided at one, or typically both ends of the sputter target. The ring can be located about 20 mm or 10 mm distant from the area of the sputter target which is actually used for sputtering. The protection ring can be used as protection during handling of the target and can be used to prevent arcing at an edge portion of the target.

As described with respect to FIGS. 1 and 2, typically rotary sputtered targets are provided. However, according to other embodiments, other target shapes can be manufactured in a similar manner. By providing a core or carrier and spraying the sputter material on the core or carrier almost any shape of a target can be manufactured. An additional step of bringing the refractory material into shape by cutting or the like can be omitted by spraying the material layer on a core or carrier of the desired shape.

According to further embodiments, which can be combined with other embodiments described herein, the layer 104 can have a thickness of 5 mm to 20 mm, for example 15 mm. According to yet further embodiments, in the case of a rotary target, the length of the target, i.e. the length along the rotation axis of the target, can be in a range of 1 meter to 5 meters, for example 4 meters.

As mentioned above, the sputter material can be provided on the core by a spraying technique such as a thermal spraying technique. Thereby a powder of the sputter material containing silicon, and optionally aluminium, and mixtures thereof, is sprayed on the carrier 102 up to the desired thickness.

For example, plasma spraying provides the material to be deposited by feeding powder into a plasma jet generated by a plasma torque. In the plasma, the material is melted and directed towards the carrier of the sputtered target or the already existing material layer on the carrier of the sputter target. The molten material rapidly solidifies and provides the sputter layer to be deposited on the target.

An example of an apparatus 300 for spraying the sputter material on the target 100 is shown in FIG. 3. The apparatus includes a vacuum chamber 302 having a port 303 for evacuating the chamber. The target 100 to be manufactured is provided within the chamber. A spraying device 310 is located such that the material 304 can be sprayed on the target. Thereby, according to different embodiments, the target 100 can be rotated. Further the spraying device 310 and/or the target can be moved along the rotation axis of the target such that a uniform layer of the material 304 can be provided on the target.

The spraying device 310 includes a plasma torque 314 and a powder feeding inlet 312. The plasma torque further includes an inlet for a carrier gas forming the jet that is directed towards a target 100. By feeding powder through the inlet 312 into the plasma jet, the material to be deposited on the sputter target is melted in the plasma jet and guided on the surface to be deposited thereon.

Some embodiments described herein refer to silicon-target or Si:Al-targets which can be used for solar cell production or other semiconductor devices, in particular semiconductor optical devices such as solar cells, displays and the like. The inventors have investigated that the lacking light conversion efficiency of solar cells, which are manufactured with state of the art silicon sputter targets, is based on impurities in the powder. Particularly, the iron content in silicon powder, which might be introduced when silicon material is grinded, deteriorates the light conversion efficiency of solar cells including silicon containing layers, e.g., in the form of anti-reflection layers and/or passivation layers. Layers that can be generated according to embodiments, described herein, or by use of embodiments described herein can be SiN layers, SiON layers, SiC layers, amorphous silicon layers, or mixtures thereof. According to some embodiments, these layers may contain Al or H, such that Si:Al or Si:H layers, or corresponding layers can be generated.

Figure 4:
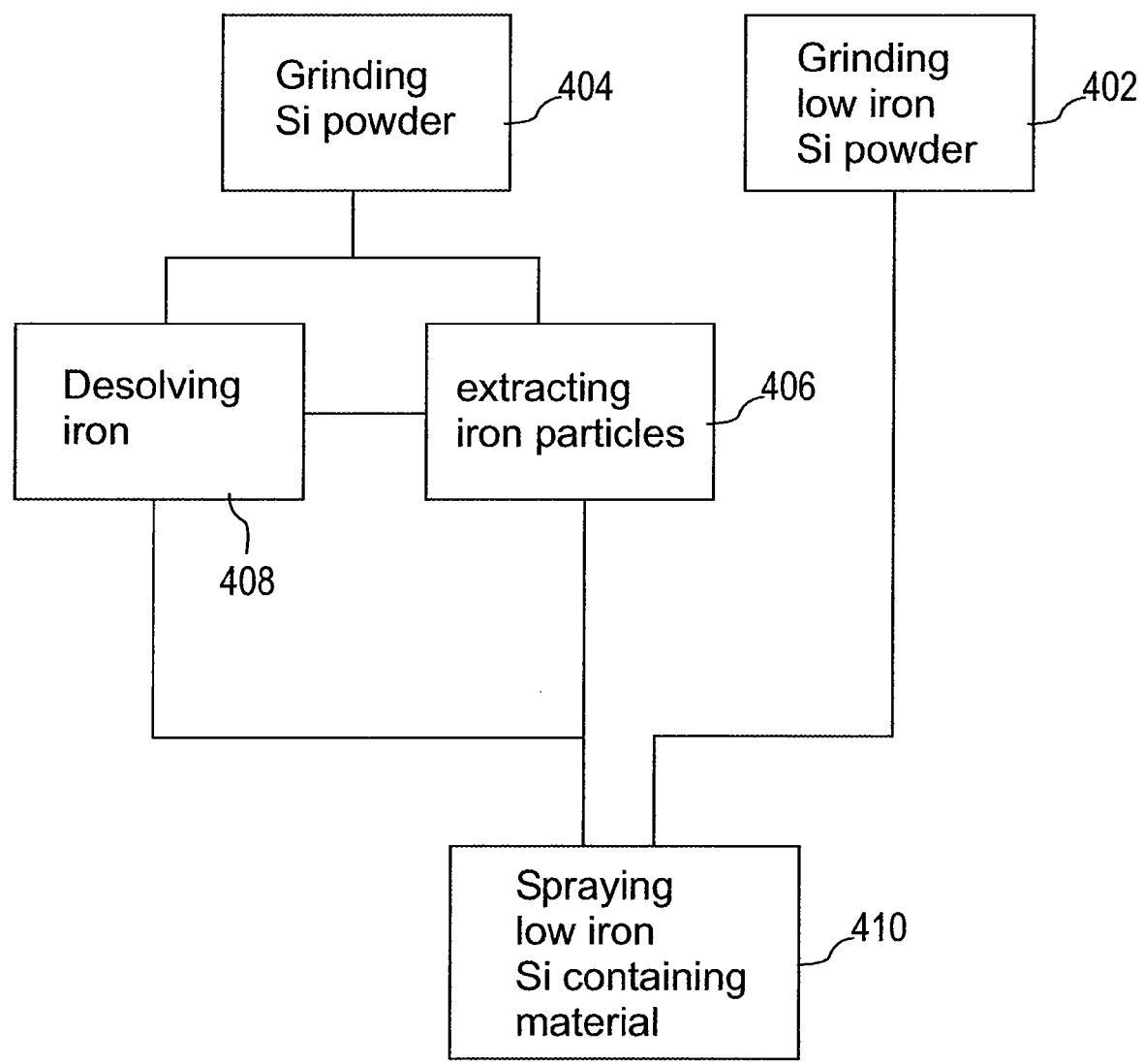
FIG. 4 shows a flow chart illustrating methods for manufacturing a silicon-containing target according to embodiments described herein.

Accordingly, as illustrated in FIG. 4, embodiments are provided which allow for low iron content silicon-containing sputter targets. According to embodiments, which can be combined with other embodiments described herein, the iron content in the silicon-containing sputter material is below 200 ppm, for example between 0 ppm and 100 ppm, typically below 50 or below 30 ppm, for example, 10 ppm or between 0.5 ppm and 30 ppm.

As shown in FIG. 4, silicon can be grinded to provide an iron content that is sufficiently low to provide the above described layers. According to one embodiment, silicon can be grinded with a mill having a milling (grinding) element from a material like silicon, titanium, mixtures thereof, or other materials which do not negatively effect the light conversion efficiency of a silicon-based solar cell. Thereby, milling components can be milling stones, balls in a ball mill, interior chamber portions in a jet mill (micronizer) or other respective components in corresponding mills that can be used for grinding silicon into the desired powder.

According to other embodiments, silicon powder can be grinded in step 404. The iron content that might be introduced in the silicon powder based on the grinding process of step 404 can be reduced in one or both of steps 406 and 408. According thereto, on the one hand the iron can be extracted from the powder by applying magnetic forces. On the other hand, the iron can be dissolved. Iron can for example be dissolved in hydrochloric acid or diluted sulphuric acid. The silicon powder can be separated from the solution to provide a low-iron content silicon-containing powder. In step 410, the low-iron content silicon-containing powder is sprayed on the sputtered target to provide a layer of sputter material.

According to different embodiments described herein, a sputter target for sputtering a silicon-containing film is provided. The sputter target can include a silicon-containing sputter material layer; and a carrier for carrying the sputter material layer, wherein the sputter material layer contains less than 200 ppm iron. For example, the sputter material layer may contain less than 50 ppm iron or between 0 ppm and 30 ppm iron such as between 0.5 ppm and 30 ppm iron, e.g., 10 ppm iron. According to yet further embodiments, the sputter material layer may optionally contain below 15 wt-% aluminum. This can typically be, between 2 and 15 wt-% aluminum or can might also, for example be below 500 ppm or below 120 ppm aluminium.

According to some embodiments, which can be combined with other embodiments described herein, the sputter material layer is a sprayed silicon-containing layer. Typically, the sputter material layer can be a thermally sprayed, e.g. a plasma sprayed silicon-containing layer. According to some implementations, which might additionally or alternatively be provided, the sputter material layer has a thickness of 5 mm to 30 mm, typically 15 mm.

According to yet further embodiments, which can be combined with other embodiments described herein, the sputter target can be a rotary sputter target. Thereby, as a further optional modification the carrier can include a material of the group consisting of: titanium, stainless steel, aluminum, copper, or mixtures thereof. For example, the carrier or core, e.g., a tube, may consist of an electrically conductive material, in particular an electrically conductive and magnetically non-conductive material.

According to another embodiment, a sputter target according to any of the embodiments described herein can be included in a sputtering apparatus for sputtering a silicon-containing layer on a substrate. According to yet another embodiment, a sputter target according to any of the embodiments described herein can be used for manufacturing a silicon-containing layer on a substrate for manufacturing of a crystalline solar cell.

According to yet further embodiments, a method of manufacturing a silicon-containing sputter target is provided. The method includes providing a carrier, providing a silicon-containing powder with an iron content of 200 ppm or below, and spraying the silicon-containing powder to deposit a silicon-containing material layer on the carrier.

According to modification of embodiments, the silicon-containing powder contains less than 30 ppm iron, for example between 0 ppm and 30 ppm iron. Additionally it is optionally possible that the silicon-containing powder contains below 15 wt-% aluminium, for example below 500 ppm or below 120 ppm aluminium, or, alternatively, between 2 and 15 wt-% aluminum.

According to different embodiments of methods for manufacturing the sputter target, the spraying can be a thermal spraying, e.g. a plasma spraying. These and other embodiments might for some implementations be applied for sputter target being a rotary sputter target.

According to different embodiments, which might alternatively or additionally to each other be provided, the silicon-containing powder can be manufactured with iron-free components, for example, with a jet mill, or a ball mill; the silicon-containing powder can be treated with an iron dissolving agent for reducing the iron content to 200 ppm or lower; and/or the silicon-containing powder can be magnetically treated for reducing the iron content to 200 ppm or lower.

While the foregoing is directed to embodiments of the invention, other and further embodiments of the invention may be devised without departing from the basic scope thereof, and the scope thereof is determined by the claims that follow.

The invention claimed is:

1. A rotary sputter target for sputtering a silicon-containing film, comprising:
   a silicon-containing sputter material layer; and
   a carrier for carrying the sputter material layer, wherein the sputter material layer contains less than 200 ppm iron.
2. The sputter target according to claim 1, wherein the sputter material layer contains less than 30 ppm iron.
3. The sputter target according to claim 1, wherein the sputter material layer contains between 0 ppm and 20 ppm iron.
4. The sputter target according to claim 1, wherein the sputter material layer contains below 15 wt-% aluminum.
5. The sputter target according to claim 1, wherein the sputter material layer is a sprayed silicon-containing layer.
6. The sputter target according to claim 1, wherein the sputter material layer has a thickness of 5 mm to 30 mm.
7. The sputter target according to claim 1, wherein the carrier includes a material of the group consisting of: titanium, stainless steel, copper, aluminum, or mixtures thereof.
8. The sputter target according to claim 1, wherein the carrier consists of an electrically conductive material.
9. The sputter target according to claim 1, wherein the carrier has a cylindrical shape.
10. A sputtering apparatus for sputtering a silicon-containing layer on a substrate, comprising:
    a sputter target rotary sputter target for sputtering a silicon-containing film, comprising:
    a silicon-containing sputter material layer; and
    a carrier for carrying the sputter material layer, wherein the sputter material layer contains less than 200 ppm iron.
11. A method of using a rotary sputter target the method comprising:
    providing the rotary sputter target in a sputtering apparatus, the rotary sputter target comprising:
    a silicon-containing sputter material layer; and
    a carrier for carrying the sputter material layer, wherein the sputter material layer contains less than 200 ppm iron; and
    depositing a silicon-containing film on a substrate with the silicon-containing sputter material layer of the rotary sputter target.
12. Method of manufacturing a silicon-containing rotary sputter target, comprising:
    providing a carrier;
    providing a silicon-containing powder with an iron content of 200 ppm or below;
    spraying the silicon-containing powder to deposit a silicon-containing sputter material layer on the carrier, wherein the sputter material layer contains less than 200 ppm iron.
13. The method according to claim 12, wherein the silicon-containing powder contains less than 30 ppm iron.
14. The method according to claim 12, wherein spraying is thermal spraying.
15. The method according to claim 12, wherein the silicon-containing powder is manufactured with iron-free components.
16. The method according to claim 12, wherein the silicon-containing powder is treated with an iron dissolving agent for reducing the iron content to 200 ppm or lower.
17. The method according to claim 12, wherein the silicon-containing powder is magnetically treated for reducing the iron content to 200 ppm or lower.
18. The method according to claim 12, wherein the carrier has a shape adapted for providing the final shape of the target after spraying of the silicon-containing powder.
19. The sputter target according to claim 5, wherein the sprayed silicon-containing layer is a plasma sprayed silicon-containing layer.
20. The sputter target according to claim 8, wherein the electrically conductive material is both electrically conductive and magnetically non-conductive.
21. The method according to claim 14, wherein the thermal spraying is a plasma spraying.

* * * * *